United States Patent
Van De Westerlo et al.

(10) Patent No.: US 6,838,940 B2
(45) Date of Patent: Jan. 4, 2005

(54) HIGH FREQUENCY POWER AMPLIFIER CIRCUIT

(75) Inventors: Marcel Henricus Wilhelmus Van De Westerlo, Nijmegen (NL); Shikhar Sinha, Nijmegen (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 31 days.

(21) Appl. No.: 10/223,312

(22) Filed: Aug. 19, 2002

(65) Prior Publication Data

US 2003/0048138 A1 Mar. 13, 2003

(30) Foreign Application Priority Data

Aug. 23, 2001 (EP) ............................................ 01203177

(51) Int. Cl.[7] ................................................. H03F 3/26
(52) U.S. Cl. ..................................... 330/262; 330/271
(58) Field of Search ................................ 330/269, 271, 330/276, 262

(56) References Cited

U.S. PATENT DOCUMENTS

| | | | | |
|---|---|---|---|---|
| 4,035,712 A | * | 7/1977 | Yarrow et al. | 322/24 |
| 4,132,925 A | * | 1/1979 | Schmutzer et al. | 315/208 |
| 5,742,205 A | * | 4/1998 | Cowen et al. | 330/269 |
| 6,011,438 A | * | 1/2000 | Kakuta et al. | 330/262 |

* cited by examiner

Primary Examiner—Dinh T. Le
(74) Attorney, Agent, or Firm—Aaron Waxler

(57) ABSTRACT

A high frequency power amplifier circuit comprises an input circuit receiving an input signal; a first cascode stage connected to the input circuit and a DC voltage source and comprising at least one FET having a source, a drain, and a gate; an second cascode stage comprising: at least one bipolar transistor having an emitter, a collector and a base and being supplied by the first cascode stage and receiving the input signal from the first cascode stage, and a delimiting means, preferably a diode, connected to the bipolar transistor and adapted to reduce the voltage level at the drain of the FET or the emitter of the bipolar transistor respectively; and an output circuit connected to the second cascode stage and outputting an output signal.

14 Claims, 8 Drawing Sheets

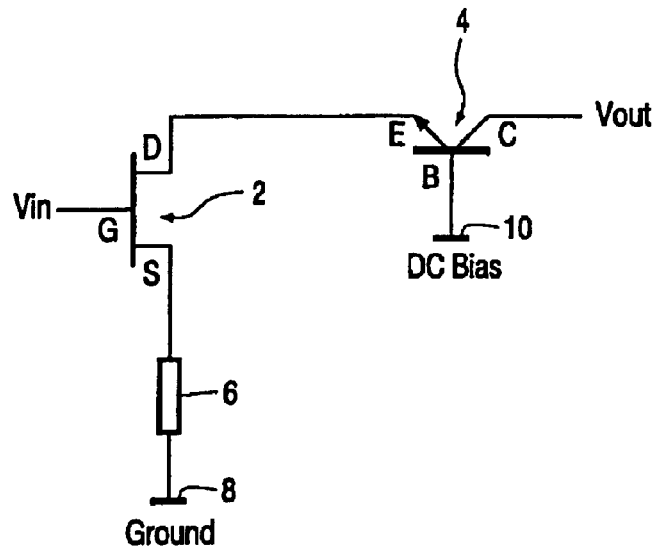
FIG. 1
PRIOR ART
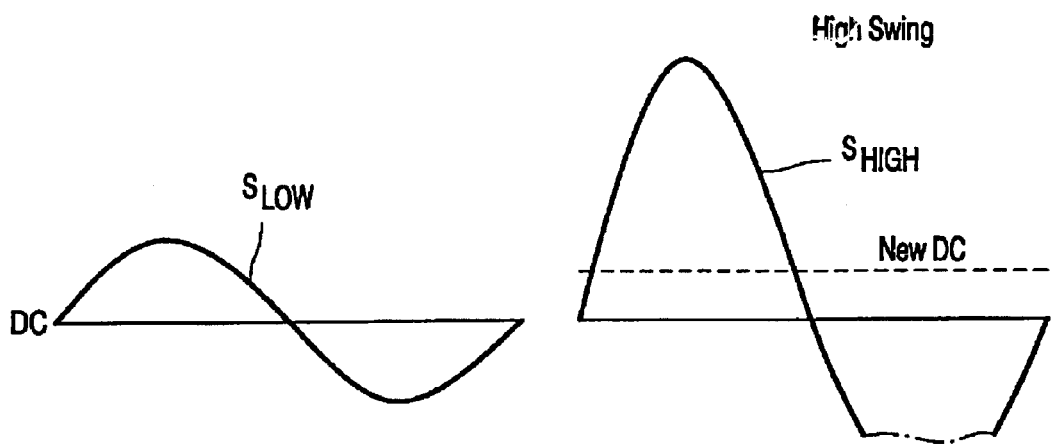
FIG. 2A
PRIOR ART
FIG. 2B
PRIOR ART

HIGH FREQUENCY POWER AMPLIFIER CIRCUIT

FIELD OF THE INVENTION

The invention relates to a high frequency power amplifier circuit, in particular to a high frequency power amplifier circuit for CATV (common antenna television) systems where a high frequency power amplifier circuit is used in coaxial cable networks to maintain signal level. The power amplifier circuit can be applied as well for optical network systems, base stations for mobile communication network systems and other high frequency amplification purposes.

BACKGROUND OF THE INVENTION

The high frequency power amplifier circuit comprises an input circuit receiving an input signal, a first cascode stage connected to the input circuit and a DC voltage source, a second cascode stage supplied by the first cascode stage and receiving the input signal from the first cascode stage, and an output circuit connected to the second cascode stage and outputting an output signal.

Such high frequency power amplifier circuits are, for example, embodied as 20 dB glass A amplifier circuits for operating in a frequency range from 40 MHz to 900 MHz. In such a high frequency power amplifier circuit, the swing at the emitter of the transistor of the second cascode stage rises above the base voltage and causes emitter-base-reverse-break down under high input signal condition, i.e. if the input signal exceeds a certain level. As the emitter voltage at the transistor of the second cascode stage increases further and goes beyond the emitter base breakdown voltage, for example 2.5 V, the transistor breaks down, and due to this break down, there is a further bigger increase in the base emitter voltage of the transistor. The increase of emitter voltage and, thereby, the voltage at the related terminal of the transistor in the first cascode stage results in a permanent break down of the transistor in the first cascode stage.

FIG. 1 shows the relevant circuit portion of a high frequency power amplifier circuit including a FET 2 having a source S, a drain D and a gate G and a bipolar transistor 4 having an emitter E, a collector C and a base B. The source of the FET 2 is connected through a resistor 6 to ground 8. The base of the transistor 4 is connected to a DC bias 10. The input signal $V_{IN}$ is supplied to the gate of the FET 2 to the emitter E of the transistor 4. The input signal is also supplied through the drain D of the FET 2 to the emitter E of the transistor 4. The output signal $V_{OUT}$ is output from the collector C of the transistor 4.

FIGS. 2a and 2b show the influence of the level of the input signal to the DC level and the emitter E of the transistor 4. FIG. 2a shows a low level input signal $S_{LOW}$, and a DC level which is unaffected by the input signal. FIG. 2b shows the case of a high input signal SHIGH having a so-called high swing. Due to distortions coming from the FET of the power supply circuit, the DC voltage and the emitter of the transistor 4 rises to a new DC level. At a certain voltage, the emitter voltage becomes the same as the base voltage, and the transistor 4 will break down and give a very high impedance at the drain of the FET. This will further increase the voltage at the drain of the FET or swing at the transmitter. As the emitter voltage increases further and goes beyond the emitter-base-break down-voltage, the increasing emitter voltage of the transistor and the drain voltage of the FET, respectively, results in a permanent break down of the FET.

In order to verify the above, the behaviour of the high frequency power amplifier circuit under a single tone input signal was studied. FIGS. 3 to 6 show the results of this study, wherein FIGS. 3 to 5 show the base voltage and emitter voltage of the transistor 4 of the second cascode stage versus the level of the input signal and the frequencies of 50 MHz, 550 MHz and 850 MHz input signal frequency. As the single tone input level increases from about 62 dBmV to 64 dBmV, the emitter voltage $V_e$ of the transistor 4 increases while the base voltage $V_b$ decreases. At a particular input level between about 65 dBmV and 68 dBmV which is in the range of the break down voltage of 2,5 V of the transistor 4 is crossed and the transistor 4 breaks without complete failure. This is followed by a steep rise in the base voltage $V_b$ and the emitter voltage $V_E$ of the transistor 4. As the emitter voltage $V_E$ is also present at the drain of the FET 2, the drain-gate-voltage and the drain-source-voltage of the FET 2 increase and cross the specified maximum limits of the FET 2. Therefore, the FET becomes liable to breakdown.

From FIGS. 3 to 5, it can also be seen that there is a hysteresis effect involved. If the level of the input signal is increased such that the base-emitter-break down-voltage of the transistor 4 is exceeded, there is a change in the transistor 4 which is not reversible if the transistor 4 is left at normal temperature. When the level of the input signal is again decreased, the base voltage and the emitter voltage of the transistor 4 follow the path $V_{b\_a}$ and $V_{e\_a}$, respectively (see FIGS. 3 to 5), and the levels are considerably lower than the previous levels. In any case, a sudden rise in base voltage and emitter voltage of transistor 4 is seen after 65 dBmV input.

FIG. 6 shows the DC current in relation to the level of the input signal, i.e. the deviation of the new DC level shown in FIG. 2b in relation to the level of the input signal. The DC current rise is maximum for 550 MHz, and for 50 MHz, the DC current decreases with increasing input level. In other words, the increase in the DC current at 550 MHz is most likely to cause a break down of the transistor and, thereby, of the FET. In other words, 550 MHz is the most critical frequency in the frequencies of 50 MHz, 500 MHz, 550 MHz and 850 MHz.

SUMMARY OF THE INVENTION

In view of the above, it is an object of the invention to improve the ruggedness of the high frequency power amplifier circuit with respect to high input signal levels.

This object is achieved by a high frequency power amplifier circuit comprising an input circuit receiving an input signal; a first cascode stage connected to the input circuit and a DC voltage source and comprising at least one transistor; a second cascode stage comprising: at least one transistor having an emitter, a collector and a base and being supplied by the first cascode stage and receiving the input signal from the first cascode stage, and a delimiting means connected to the transistor of the second cascode stage and adapted to reduce the voltage level at the emitter of the transistor and at the respective electrode of the transistor of the first cascode stage; and an output circuit connected to the second cascode stage and outputting an output signal.

The break down of the transistor in the second cascode stage and the transistor in the first cascode stage is achieved by the delimiting means, which reduce the voltage level at the drain of the FET or the emitter of the bipolar transistor, respectively. In the modules discussed above, a reduction of the base voltage $V_b$ of the transistor of the second cascode stage can be reduced by an amount of up to 8 V as will be discussed in detail below.

According to a preferred embodiment of the invention, a high frequency power amplifier circuit is provided, wherein the input circuit of the amplifier circuit is designed to supply the input signal as balanced input signals to the first cascode stage which comprises at least a pair of transistors, and wherein the second cascode stage comprises at least a pair of transistors which output balanced second cascode stage output signals to the output circuit which combines the second cascode stage output signals to produce the output signal. The delimiting means are particularly advantageous in such a circuit structure processing balanced input and output signals although they re also advantageous in connection with a circuit comprising only a cascode arrangement and no doubled pre-stage transistors which are doubled for AC and stacked for DC.

According to a preferred embodiment of the invention, a high frequency power amplifier circuit is provided, wherein the first cascode stage comprises two transistor stages having a pair of transistors each. This improves the performance of the circuit.

According to a preferred embodiment of the invention, a high frequency power amplifier circuit is provided, wherein the transistors of the first cascode stage are FETs an, preferably, the transistors of the second cascode stage are bipolar transistors. It has been verified that the delimiting means connected to the bipolar transistors of the second cascode stage are sufficient to protect the pair of FETs in the second FET stage of the power supply circuit as the pair of FETs in the first stage of the power supply circuit are not endangered by the influence of the input signal to the transistors of the second cascode stage as much as the pair of FETs in the second stage of the power supply circuit.

In a further preferred embodiment of the invention, a high frequency power amplifier circuit is provided wherein the FETs are MESFETs. Such dies can advantageously be embodied on a chip together with the bipolar transistors and other circuit elements.

The use of field effect transistors (FETs) in the first cascode stage has the advantage that such circuit elements score better than SI-transistors with respect to limiting the amount of parasitics in general for high frequency power amplifiers. Therefore, the use of such FETs would be preferred. A disadvantage of such FETs, that they are sensitive for break down to an impedance which is too high, is removed by the use of the delimiting means such that the FETs can be used without regard to their sensitivity.

According to a further advantageous embodiment, the FETs are defined in a substrate of a III–V semiconductor material. In this embodiment, the gate electrode of the FET can be provided in a separate metal layer, as the skilled person will understand the III–V material have the advantage, that the amount of parasitics is very limited. Examples of III–V semiconductor materials include GaAs, Inp, GaIn As, Ga N.

According to another advantageous embodiment, a high frequency power amplifier circuit is provided wherein the first cascode stage is a common source stage and the second cascode stage is a common base stage. For DC the common source stage provides a DC current also for the common base stage. For AC the common source provides the gain where the common base stage transfers this gain into a high ohmic load. The impedance of the common base stage at the base is low where the output at the collector side is high.

According to a further advantageous embodiment of the invention, a high frequency power amplifier circuit is provided, wherein the delimiting means is adapted to clamp the swing of the input signal at a predetermined value. This means that the peak of the input signal is cut off to reduce the amplitude of the input signal and to protect the bipolar transistor and, consequently, the FET.

According to a further advantageous embodiment of the invention, a high frequency power amplifier circuit is provided, wherein the delimiting means comprise a diode connected across the base-emitter path of the bipolar transistor. As will be explained below, such a diode has the most positive effect in reducing the level of the input signal and the emitter of the bipolar transistor without influencing the performance of the power amplifier circuit as a whole.

According to a further advantageous embodiment, a high frequency power amplifier circuit is provided, wherein the diode is embodied by an additional bipolar transistor, the base and collect of which bipolar transistor being connected to each other. This embodiment has the advantage that the function of the diode is obtained by a bipolar transistor which can be formed on the chip together with the bipolar transistor forming the amplifier stage.

According to a further advantageous embodiment of the invention, a high frequency power amplifier circuit is provided, wherein the delimiting means is a resistor connected between the emitters of the pair of bipolar transistors. Such a resistor which can advantageously be used in the circuit arrangement with balanced input and output signals, also has the effect to reduce the voltage and the emitter(s) of the bipolar transistor(s).

A comparison of the influence of a resistor or a diode on the behaviour of the overall high frequency amplifier circuit shows that the diode is somewhat slower in response because of its high capacitance but has only negligible effects on important circuit characteristics like gain at low and high frequencies, input return losses, output return losses, and cross modulation. The delimiting means comprising a resistor are, as compared to the diode, faster, have, however, a somewhat minor phase response at low frequencies, a better phase response at high frequencies, are better with respect to input and output return losses and are somewhat inferior with respect to cross modulation, whereas the rest of distortions appears to be acceptable.

According to a further advantageous embodiment of the invention, a high frequency power amplifier circuit is provided, wherein the delimiting means is integrated into the amplifier circuit on a chip in order to improve effectiveness in production and operation.

According to a further advantageous embodiment of the invention, a high frequency power amplifier circuit is provided wherein the FETs and the bipolar transistor(s) are integrated dies on a chip to further improve productivity, operation and ruggedness. It is herewith particularly preferred that the drain(s) of the FETs and emitter(s) of the bipolar transistor(s) are integrated within the die on the chip.

Further advantageous embodiments of the invention are characterized in the rest of the sub-claims.

BRIEF DESCRIPTION OF THE DRAWINGS

Embodiments of previous high frequency power amplifier circuits and high frequency power amplifier circuits according to the invention are now described with reference to the drawings in which FIG. 1 is a schematic view of a portion of a previous high frequency power amplifier circuit;

FIGS. 2a and 2b graphical representations of input signals and the influence of swing;

DETAILED DESCRIPTION OF THE INVENTION

Figure 3:
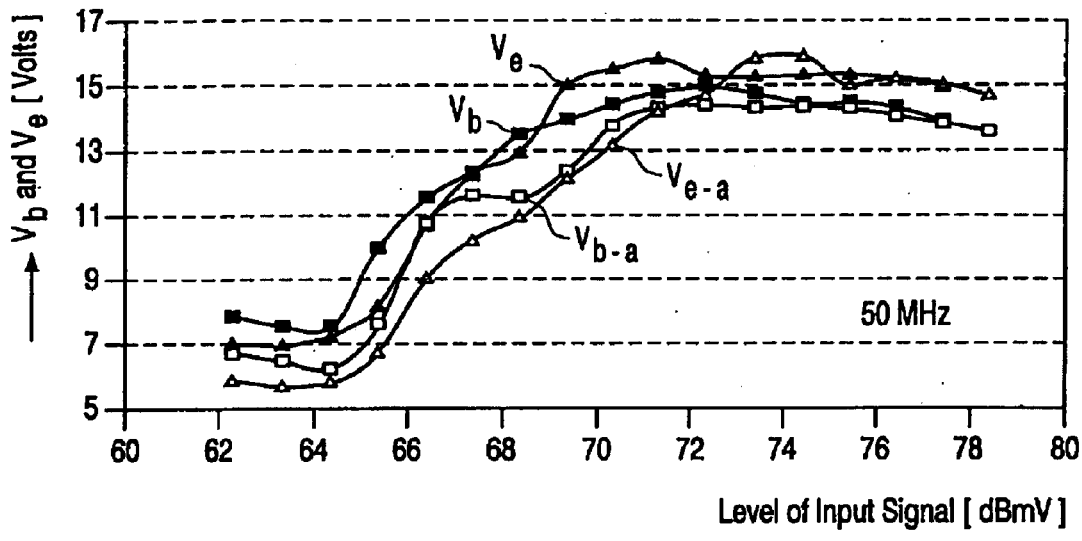
FIGS. 3 to 5 graphical representations of base voltage and emitter voltage of the transistor of the second cascode stage versus the level of the input signal and various frequencies of the input signal.
Figure 4:
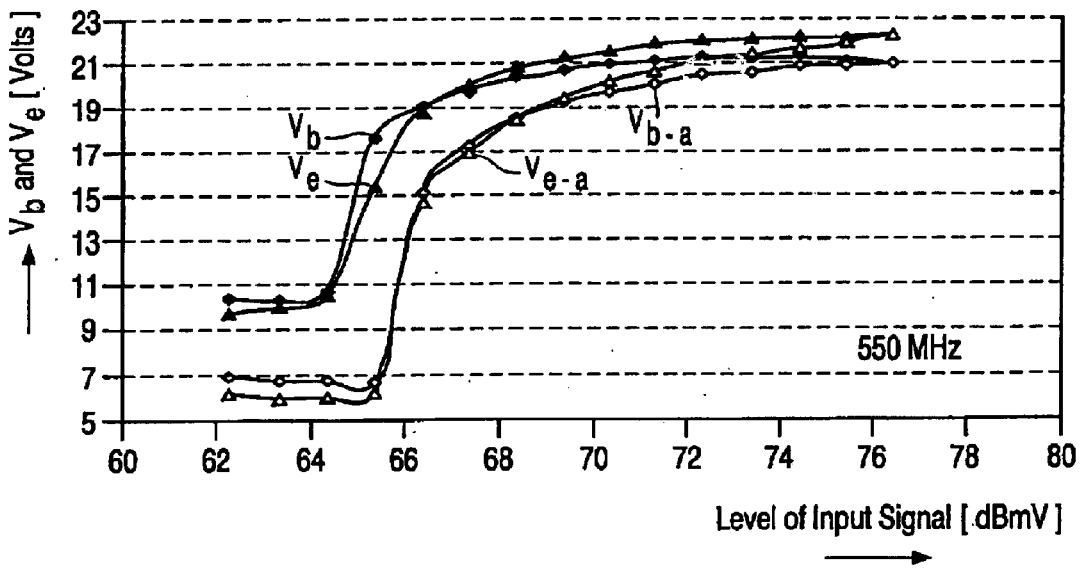
Figure 5:
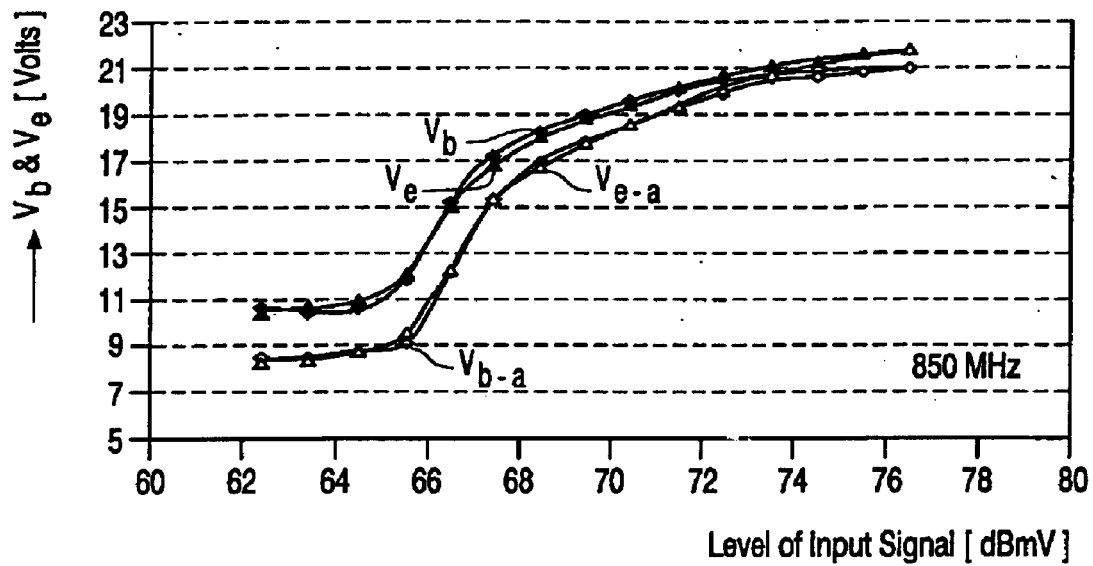
Figure 6:
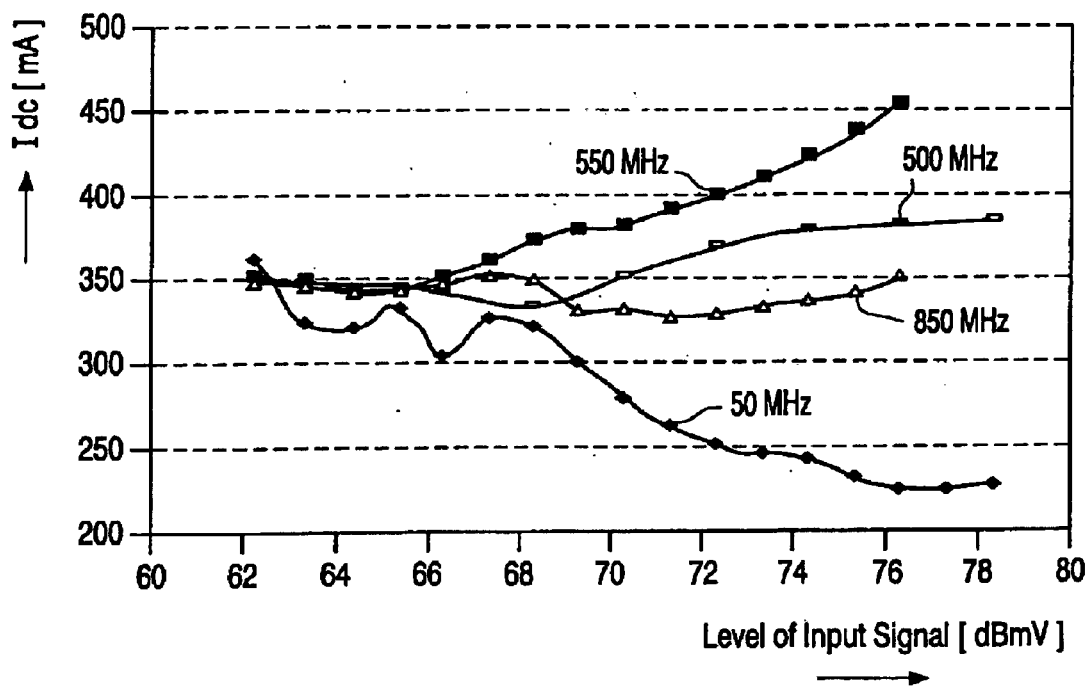
FIG. 6 a graphical representation of the DC current at the drain of the FET in relation to the level of the input signal for various frequencies of the input signal.
Figure 7:
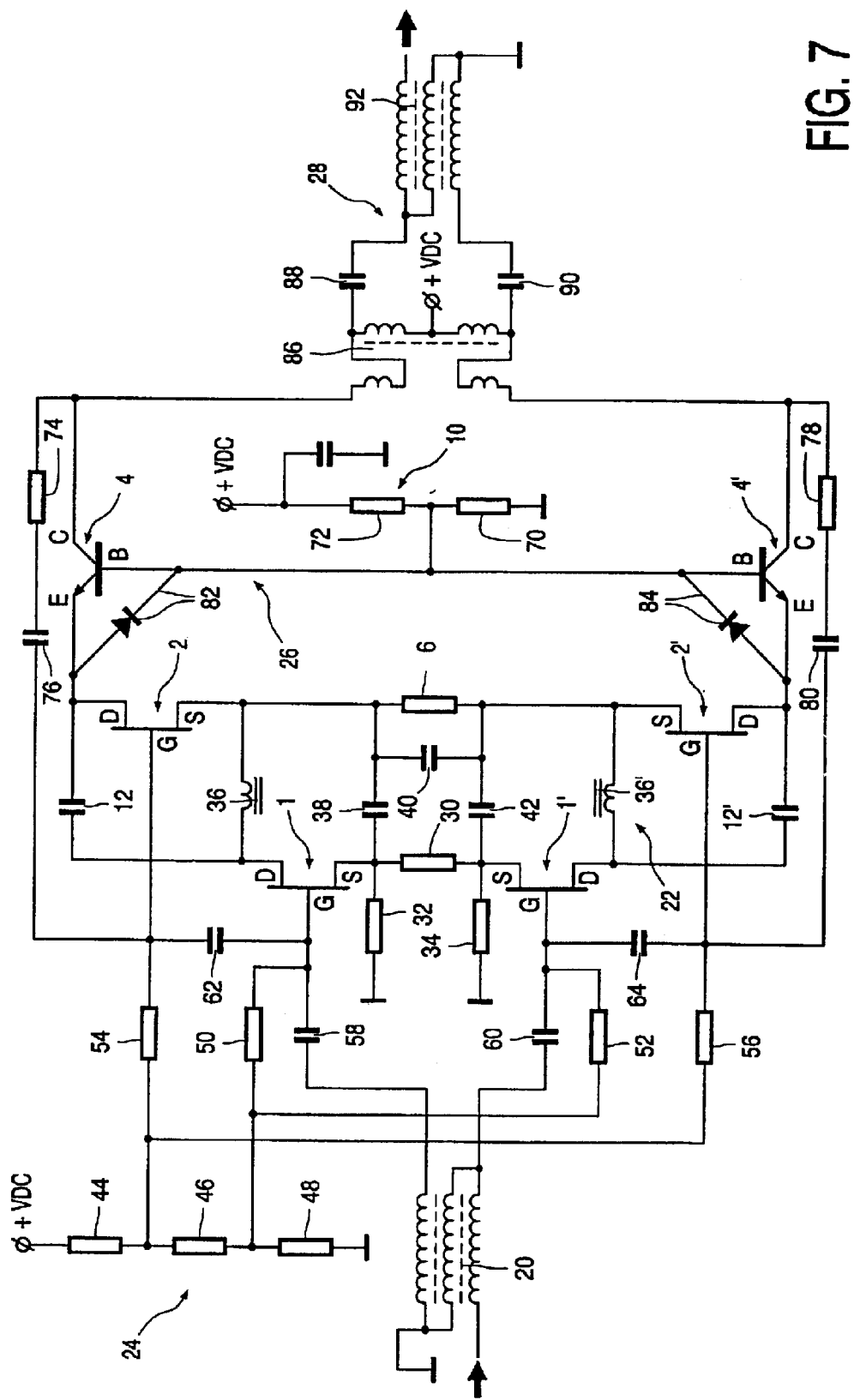
FIG. 7 a schematic circuit diagram of a high frequency power amplifier circuit having a diode as delimiting means across the base emitter path of the bipolar transistor of the amplifier stage.

The high frequency power amplifier circuit of FIG. 7 comprises an input circuit 20 receiving an input signal and comprising an inductance. A first cascode stage 22 is connected to the input circuit 20 and a DC voltage source 24. The first cascode stage 22 comprises two pairs of FETs 1, 1' and 2, 2' having a source S, a drain D and a gate G, respectively. An second cascode stage 26 is connected to the current supply stage 22 which second cascode stage comprises two transistors 4, 4' each having an emitter E, a collector C and a base B. The second cascode stage is connected to an output circuit 28 which combines the output signals of the two transistors 4, 4' to produce the output signal "output".

The first cascode stage 22 comprises two pairs of FETs 1, 1' and 2, 2' the source as of the FET 1 and the drain D of FET 1' are connected through a resistor 30, and two resistors 32, 34 connect the two ends of resistor 30 to ground to form a ground circuit for the FETs 1, 1'. The source as of FET 2 and the drain D of FET 2' are connected through resistor 6 forming a virtual ground. An inductance 36, 36' and capacitors 38, 40, 42 complete the circuitry between the first pair of FETs 1, 1' and the second pair of FETs 2, 2' of the first cascode stage 22.

The DC voltage source 24 comprises series of resistors 44, 45, 46, 48 connected between the voltage VDC and ground. The gates of the FETs 1, 1' and 2, 2' are connected to the voltage source through resistors 50, 52 and 54, 56, respectively, which are connected to the ends of resistor 46 as shown in FIG. 7.

The input signal is coupled through capacitances 58, 60 to the gates G of FETs 1, 1', respectively, and through further capacitances 62, 64 to the gates G of FETs 2, 2', respectively. The sources S of FETs 1, 1' are connected through further capacitances 12, 12' to the drain of FET 2 and the source of FET 2', respectively. The drain D of FET 2 is connected to the emitter E of transistor 4, and the source S of FET 2' is connected to the emitter E of transistor 4', the collectors of the transistors 4, 4' being the output of the second cascode stage 26. The base terminals of the two transistors 4, 4' are connected to each other and to a DC voltage supply 10 comprising two resistors 70, 72 connected between a supply voltage $+V_{DC}$ and ground, and a capacitor 74 connected between the supply voltage $V_{DC}$ and ground. The node between the resistors 70 and 72 is connected to the base terminals B of the transistors 4, 4'. A feedback circuit consisting of a resistor 74 and a capacitor 76 connects the collector of transistor 4 to the gate of FET 2, and a feedback circuit consisting of a resistor 78 and a capacitor 80 connects the collector of transistor 4c to the gate of FET 2'. Two diodes 82, 84 connect the emitter E to the base B each of the transistors 4, 4', respectively. The diodes 82, 84 are conducting from the emitter E to the base of the respective transistors 4, 4'. The function of the diodes 82, 84 is described in more detail below.

The output circuit 28 comprises a first inductor 86 connected to supply voltage $+V_{DC}$, to capacitances 88, 90 for coupling the output of the inductor 86 to output and a further inductor 92 connected to the capacitances 88, 90 for outputting the output signal "output" and being, as to the rest, connected to ground.

It is apparent from the above, that the high frequency power amplifier of the invention is a cascode circuit build up with a common source stage (FET) and a common base stage (bipolar transistors). For DC the common source stage provides the DC current also for the common base stage. For AC the common source makes the gain where the common base stage transfers this gain into a high ohmic load. The impedance of the common base stage at the base is low where the output at the collector side is high.

Figure 8:
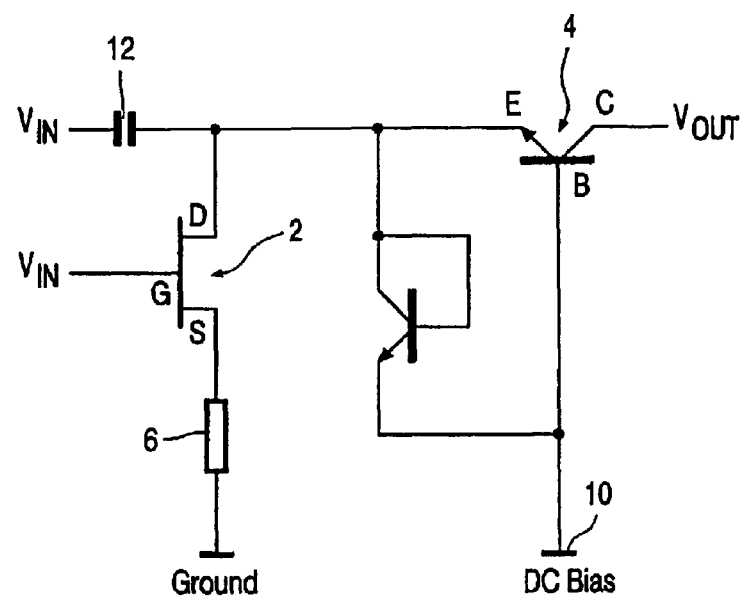
FIG. 8 a schematic circuit diagram of a high frequency power amplifier circuit having a second bipolar transistor connected as a diode across the base emitter path of the bipolar transistor of the amplifier stage.

FIG. 8 shows a portion of the circuit of FIG. 7 wherein the diodes 82, 84 of FIG. 7 are replaced by a bipolar transistor 82' wherein the base and the collector of the transistor 82' are connected to each other to embody a diode between the emitter E of transistor 4 and the base B thereof. This arrangement has with respect to the arrangement of FIG. 7. the advantage that the transistor 82' can be formed in one run with the transistor 4 using the same technology.

Figure 9:
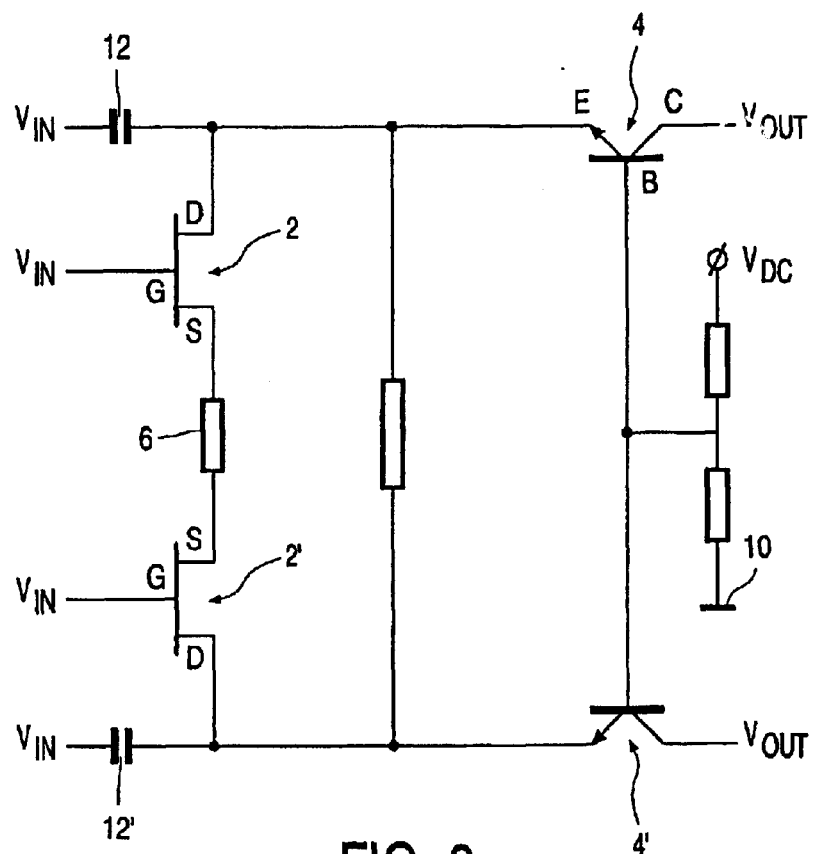
FIG. 9 a schematic circuit diagram comprising a resistor between the emitters of a pair of bipolar transistors in the second cascode stage as a delimiting means.
Figure 10:
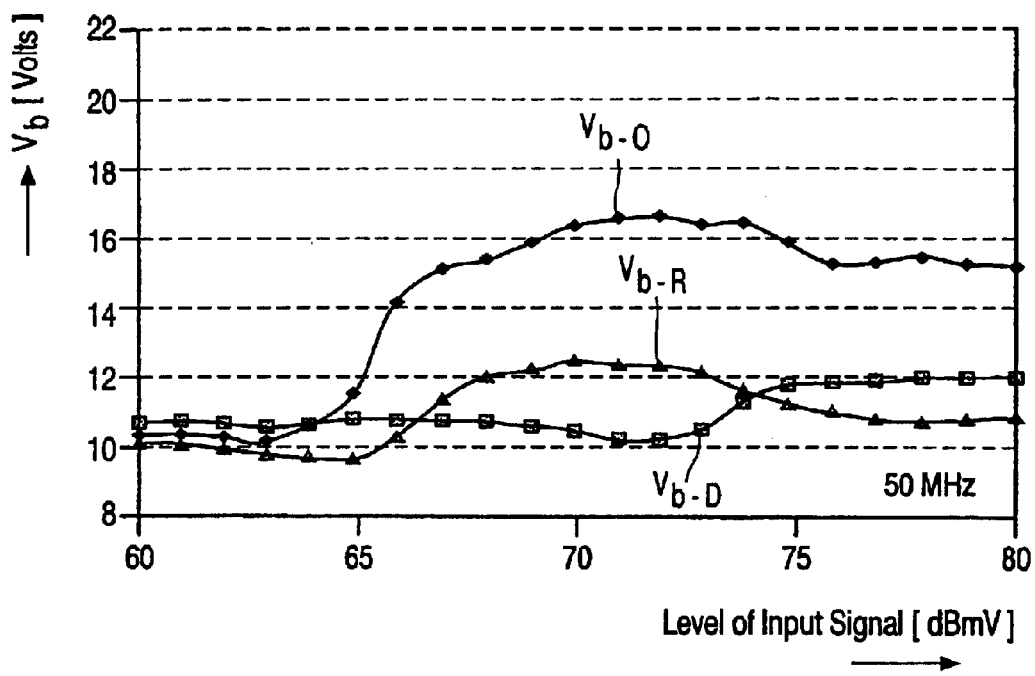
FIGS. 10 to 12 graphical representations of the base voltage and the bipolar transistor of the second cascode stage without delimiting means, with a resistor as delimiting means and with a diode as delimiting means with respect to the level of the input signal for various frequencies of the input signal.

FIG. 9 shows a simplified circuit diagram comparable to the circuit diagram of FIG. 7 wherein a resistor 94 is connected between the emitter terminals E of the transistors 4, 4'. Resistor 94 serves as in the case of the diodes 82 and 84 in FIG. 7 and the transistor 82' in FIG. 8 to reduce the voltage level and the drain of FET 2 or the source of FET 2', respectively or the emitter of the bipolar transistors 4, 4', respectively.

The clamping diodes 82, 84 and the transistor 82' prevent a break down of the transistor and, consequently, of the FET by limiting the voltage peak of the emitter base voltage to for example 0,5 V. Therefore, emitter base reverse break down does not occur anymore. It is important to know that this circuit construction does not effect the normal functioning of the cascode circuit in linear application since the impedance level at the emitters E of the transistors 4, 4' is very low. On the other hand, the diode 82, 84 or the transistor 84' will come into action only at high input levels. Therefore, the cascode circuit can be improved for high input signals by placing the reverse protection diode 80, 84 at the base emitter path of the transistors 4, 4'. Whereas previous circuits could handle only signals of 1 V (60 dBmV) resulting in damage transistors, the circuit with the diode 82, 84 or the transistor 84' improves the circuit signal handling by more than 20 dB without effecting any electrical performance. Similar results can be obtained with the circuit of FIG. 9 where the diodes are replaced by resistor 94 as described.

FIGS. 10 to 14 show the base voltage of the transistor 4 without delimiting means, i.e. $V_{b\_o}$, with a resistor as delimiting means, i.e. $V_{b\_R}$ and with a diode/diode connected transistor, i.e. $V_{b\_D}$ at frequencies of 50 MHz, 550 MHz and 850 MHz, respectively. As can be seen from FIG. 10, the base voltages $V_{b\_R}$ and $V_{b\_D}$ remain at a level between 10 and 12 V almost irrespective of the level of input signal, whereas the base voltage of the transistor 4 in the unprotected circuit, i.e. $V_{b\_o}$, rises up to about 17 V maximum, the steep rise starting at about 65 dBmV.

Figure 11:
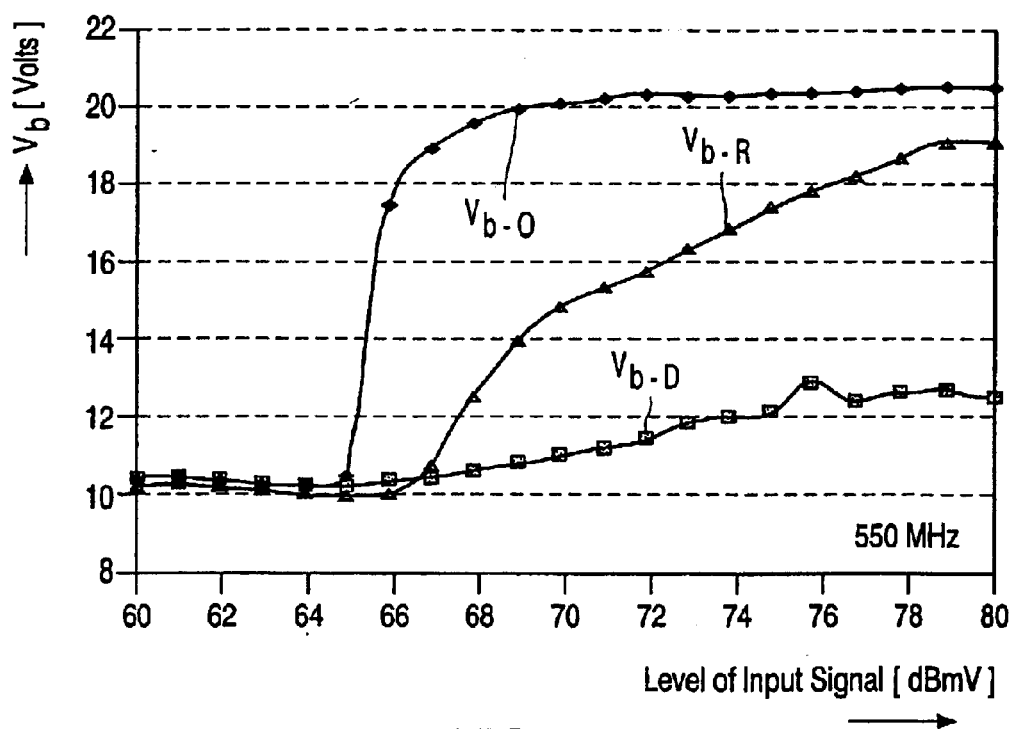

In FIG. 11, the base voltage rises from 10 to about 13 V in a range of input signal levels from 60 to 80 dBmV. The base voltage with a resistor as protective means raises from 10 V and about 67 dBmV input level to about 19 V at 80 dBmV almost linearly. The base voltage of the unprotected circuit rises steeply at about 65 dBmV from 10 V to almost 20 V which is about 8 V higher than the comparable values of the circuitry with a protective diode or transistor.

Figure 12:
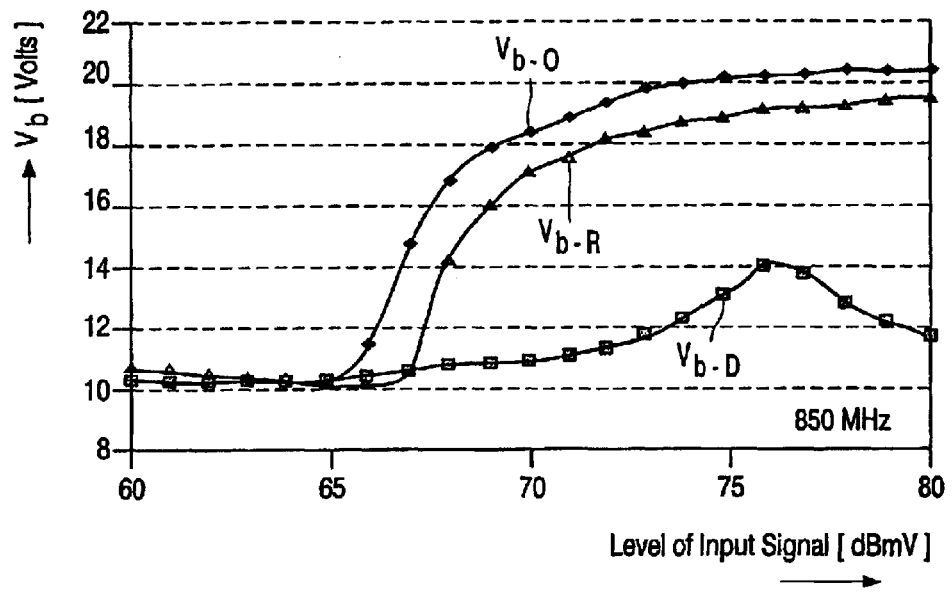

In FIG. 12, only the circuit protected by a diode or transistor remains at an acceptable level between 10 and 14 V whereas the base voltage in the unprotected circuit and in the circuit protected by a resistor rises steeply above 65 dBmV and reaches approximately 20 V at about 74 dBmV. To summarize, it can be verified that the delimiting means of the embodiments of the invention enlarge the acceptable range of levels of input signals by about 20 dBmV.

Figure 13:
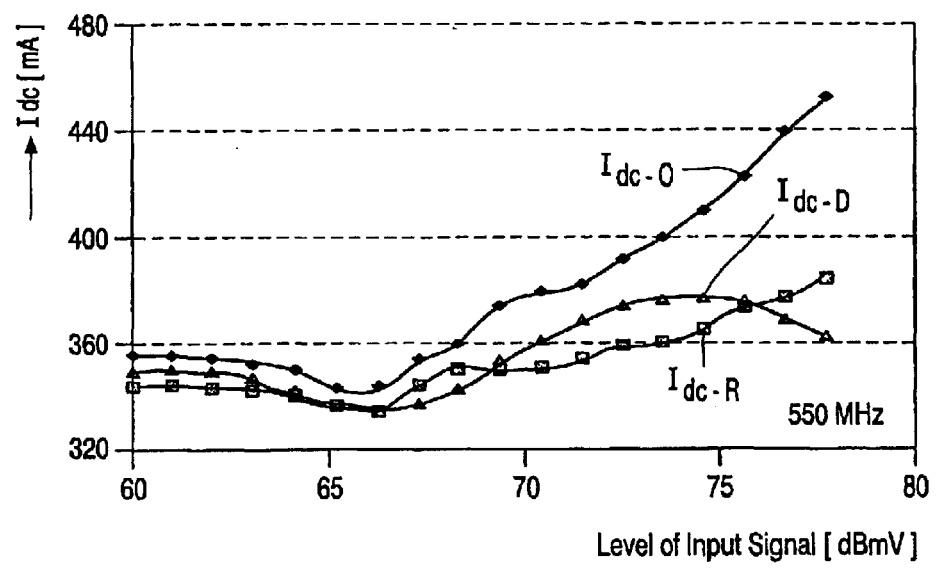
FIG. 13 a graphical representation of the DC current at the drain of the FET of the first cascode stage in relation to the level of the input signal for a circuit having no delimiting means, a circuit having a diode as delimiting means and a circuit having a resistor as delimiting means and a particular frequency of the input signal.

FIG. 13 shows the changes in the DC current and the drain D of the FET 2 or 2' with rising level of input signal for a input signal frequency of 550 MHz. It can clearly be seen that the DC current goes up steeply in the circuit without delimiting means, which is represented by the curve $I_{DC}0$ as compared to the cases of a diode or transistor as a protective circuit, represented by the curve $I_{DC\_D}$ or the circuit protected by a resistor, which is indicated by the curve $I_{DC\_R}$. Therefore, the tendency of the FET, to be destroyed, is greatly reduced.

Figure 14:
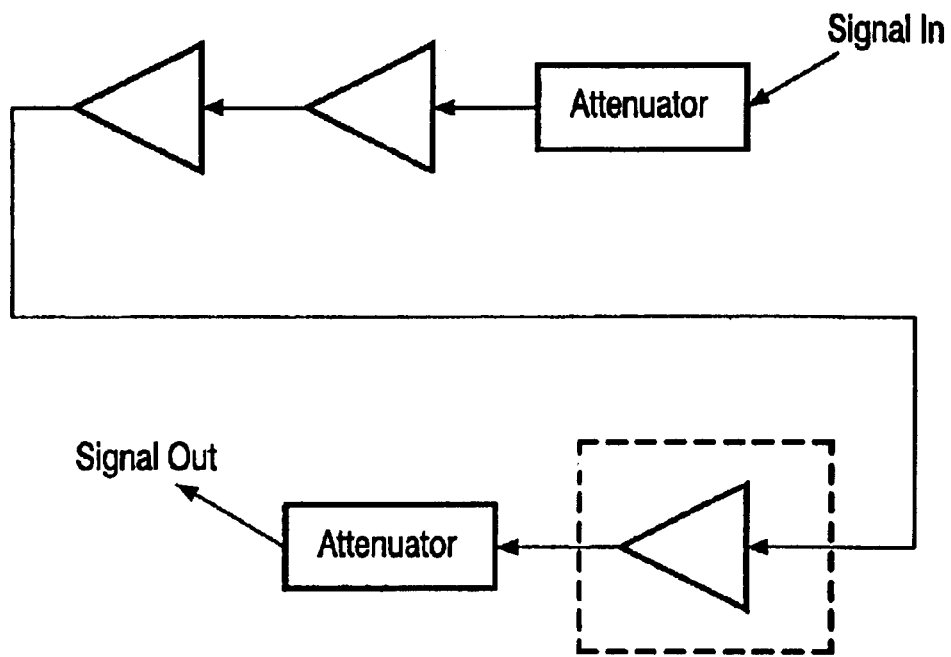
FIG. 14 a test arrangement for carrying out a multitone Vi max test.

FIG. 14 shows an experiment which was performed as a multi tone Vi max-Test. The test arrangement of FIG. 14 comprises an attenuator 100, an amplifier 102, a second stage amplifier 104, a third amplifier 106 to be tested and an output attenuator 108 having 10 dB. The input signal was 79 channels. Initially, the output signal was adjusted at 50 dBmV, and the attenuator 100 was set at 30 dB. Then, the input level was increased at steps of 1 dB by decreasing the attenuation of the attenuator 100. The test was conducted on an amplifier circuit 106 without protective means, amplifier circuits 106 with resistances as protective means (47 Ohm, 100 Ohm and 150 Ohm) with a diode as protective means and a transistor connected as a diode as a protective means. It was confirmed that the amplifier circuit 106 without protective means broke at 66 dBmV output level. The amplifier circuits 106 with a resistor and with diodes did not break until 85 dBmV output level. Therefore, this experiment also confirmed the advantages stated above.

Figure 15:
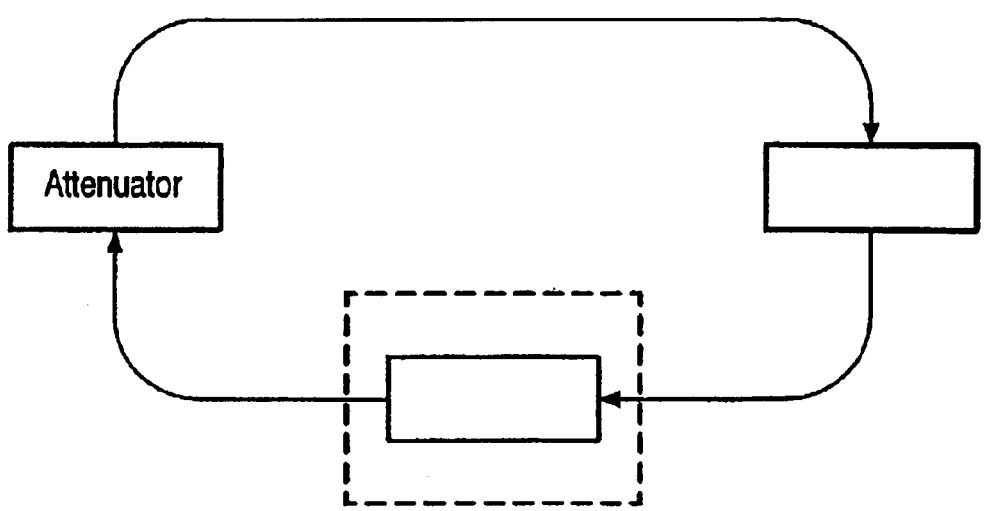
FIG. 15 another test arrangement to confirm ruggedness of the circuit according to embodiments of the invention.

FIG. 15 shows the diagram of another test to confirm the ruggedness of the amplifier circuit of the invention. The arrangement comprises an attenuator 110, a first amplifier 112 and an amplifier 114 to be tested. The unprotected amplifier circuit broke at an attenuation of 27 dB. The amplifier circuits 114 with a diode as protective circuit broke at 9 dB of attenuation. The amplifier circuit 114 with a resistor as protective circuit did not break even if all attenuation was removed. One can conclude therefrom that the amplifier circuit 114 with a diode broke before the amplifier circuit with a resistor because the diode is slower in comparison to the resistor.

New characteristics and advantages of the invention have been set forth in the foregoing description. It will be understood, however, that this disclosure is, in many respects, only illustrative. Changes may be made in details without exceeding the scope of the invention. For example, the transistors of the first cascode stage may by other transistors but FETs, the first and second cascode stages may have more transistor stage or pairs then the number of transistors shown in the drawings, and the circuit may be used for other purposes then the once described.

What is claimed is:

1. A high frequency power amplifier circuit comprising:
    (a) an input circuit receiving an input signal;
    (b) a first cascode stage connected to the input circuit and a DC voltage source and comprising a FET transistor;
    (c) a second cascode stage comprising:
        (c1) a bipolar transistor having an emitter, a collector and a base and being supplied by the first cascode stage and receiving the input signal from the first cascode stage, and
        (c2) a delimiting means connected to the bipolar transistor of the second cascode stage and adapted to reduce the voltage level at the emitter of the bipolar transistor and at a respective electrode of the FET transistor of the first cascode stage; and
    (d) an output circuit connected to the second cascode stage and outputting an output signal.

2. The high frequency power amplifier circuit of claim 1, wherein
    the input circuit of the amplifier circuit is designed to supply the input signal as balanced input signals to the first cascode stage which comprises at least a pair of the FET transistors, and wherein
    the second cascode stage comprises at least a pair of the bipolar transistors, which output balanced second cascode stage output signals to the output circuit which combines the second cascode stage output signals to produce the output signal.

3. The high frequency power amplifier circuit of claim 1, wherein the first cascode stage comprises two transistor stages having a pair of the FET transistors each.

4. The high frequency power amplifier circuit of claim 1, wherein the FET transistor of the first cascode stage is formed in a substrate of a III–V semiconductor material.

5. The high frequency power amplifier circuit of claim 1, wherein the first cascode stage is a common source stage and the second cascode stage is a common base stage.

6. The high frequency power amplifier circuit of claim 1, wherein the delimiting means is adapted to clamp the swing of the input signal at a predetermined value.

7. The high frequency power amplifier circuit of claim 1, wherein the delimiting means comprise a diode connected across a base-emitter-path of the bipolar transistor.

8. The high frequency power amplifier circuit of claim 2, wherein the delimiting means is a resistor connected between the emitters of each pair of bipolar transistors.

9. A high frequency power amplifier circuit comprising:
  (a) an input circuit receiving an input signal;
  (b) a first cascode stage connected to the input circuit and a DC voltage source and comprising two transistor stages having a pair of FET transistor each;
  (c) a second cascode stage comprising:
    (c1) a bipolar transistor having an emitter, a collector and a base and being supplied by the first cascode stage and receiving the input signal from the first cascode stage, and
    (c2) a delimiting means connected to the bipolar transistor of the second cascode stage and adapted to reduce the voltage level at the emitter of each bipolar transistor and at a respective electrode of at least one of the FET transistors of the first cascode stage; and
  (d) an output circuit connected to the second cascode stage and outputting an output signal.

10. The high frequency power amplifier circuit of claim 9, wherein
  the input circuit of the amplifier circuit is designed to supply the input signal as balanced input signals to the first cascode stage, and wherein
  the second cascode stage comprises at least a pair of the bipolar transistors, which output balanced second cascode stage output signals to the output circuit which combines the second cascode stage output signals to produce the output signal.

11. The high frequency power amplifier circuit of claim 9, wherein the first cascode stage is a common source stage and the second cascode stage is a common base stage.

12. The high frequency power amplifier circuit of claim 9, wherein the delimiting means is adapted to clamp the swing of the input signal at a predetermined value.

13. The high frequency power amplifier circuit of claim 9 wherein the delimiting means comprise a diode connected across a base-emitter-path of the bipolar transistor.

14. The high frequency power amplifier circuit of claim 10, wherein the delimiting means is a resistor connected between the emitters of each pair of bipolar transistors.

* * * * *